United States Patent
Ohta et al.

(10) Patent No.: US 6,803,846 B2
(45) Date of Patent: Oct. 12, 2004

(54) ACTUATOR

(75) Inventors: Masahiro Ohta, Wako (JP); Toru Sukigara, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 10/692,658

(22) Filed: Oct. 23, 2003

(65) Prior Publication Data

US 2004/0145435 A1 Jul. 29, 2004

(30) Foreign Application Priority Data

Oct. 23, 2002 (JP) ........................................ 2002-308083

(51) Int. Cl.[7] .............................................. H01F 55/00
(52) U.S. Cl. ........................................ 335/215; 310/26
(58) Field of Search ............................. 335/215; 310/26

(56) References Cited

U.S. PATENT DOCUMENTS

| | | | | |
|---|---|---|---|---|
| 5,958,154 A | * | 9/1999 | O'Handley et al. | 148/312 |
| 6,157,101 A | * | 12/2000 | Ullakko | 310/26 |
| 6,515,382 B1 | * | 2/2003 | Ullakko | 310/26 |
| 6,681,698 B2 | * | 1/2004 | Wehmeier et al. | 101/365 |

* cited by examiner

*Primary Examiner*—Ramon M. Barrera
(74) *Attorney, Agent, or Firm*—Lahive & Cockfield, LLP; Anthony A. Laurentano, Esq.

(57) ABSTRACT

An actuator comprising a magnetic, resilient, shape memory member formed by a substance having a twin structure, and a magnetic field generator, at least part of the magnetic, resilient, shape memory member being disposed in a gradient magnetic field generated from the magnetic field generator such that the twin structure is reoriented by the magnetic field, whereby the shape memory resilient member is driven.

8 Claims, 7 Drawing Sheets

$\bar{H} = 0$

Twin Boundary

New Twin Boundary

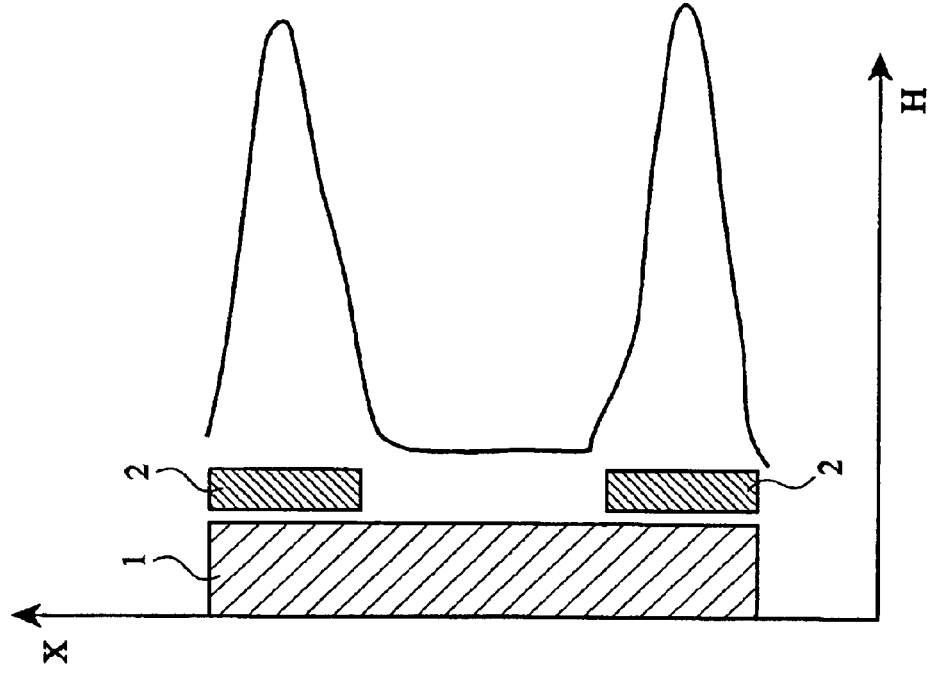
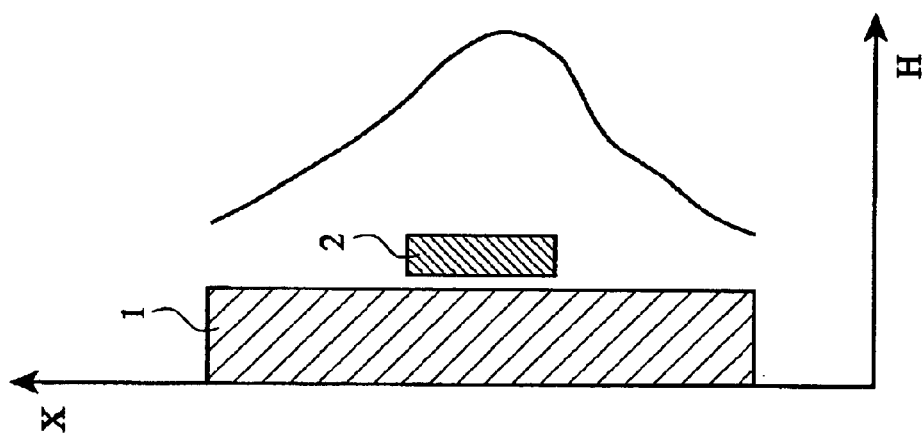

// ACTUATOR

FIELD OF THE INVENTION

The present invention relates to an actuator comprising a magnetic shape memory alloy member such as a spring, etc., which can be driven in a relatively small magnetic field, thereby giving large stroke and output force.

BACKGROUND OF THE INVENTION

In the technical fields of robots, machine tools, automobiles, etc. utilizing electromagnetic motors, driving systems are required to have reduced weight. However, because the output densities of the electromagnetic motors depend on the weight of motors, there are limitations in the reduction of weight in the actuators using electromagnetic motors. Accordingly, demand is mounting on actuators providing large outputs with reduced size and weight.

Conditions required for the actuators are that a movable member is displaced to a desired position when driven, and returns to an original position without fail while idling, and that a large output is obtained to drive the movable member even though there is a large load. In order that the movable member returns to an original position without fail while idling, a spring should be used as a biasing member for the movable member. However, when the spring has a large repulsive force, a large force is required to drive the movable member against the spring force. Thus required is a spring deformable with a small force.

The shape memory alloys are attracting much attention particularly as actuator materials, because they can give as large displacement (shape recovery strain) as up to about 5%. The shape memory alloys plastically deformed at a certain temperature regain original shapes when heated to temperatures equal to or higher than their transformation temperatures. Thus, when an alloy is caused to memorize a certain shape by a heat treatment with its shape constrained in an austenite phase, a high-temperature phase, it can regain original shape due to a reverse transformation mechanism by heating, even after deformation in a martensite phase, low temperature phase. This phenomenon is utilized for actuators. However, a shape memory phenomenon by temperature change requires heating and cooling, and heat diffusion particularly at the time of cooling is rate-determining, resulting in slow response in the temperature control.

Accordingly, an actuator utilizing a magnetic shape memory alloy having a phase transformation structure (twin structure) was proposed (JP 11-509368 A and JP 2001-525159 A). The driving of this actuator utilizes deformation caused by the reorientation of martensitic unit cells (magnetization vectors in the cells) in the direction of a constant magnetic field, which is applied in a martensite state.

In thin ribbons (JP 11-269611 A) and thin films (JP 2001-329347 A) of magnetic shape memory alloys such as Fe—Pd alloys, etc. having excellent workability, strain occurs to some extent by a relatively small, constant magnetic field of 1 to 2 kOe, but an extremely large, constant magnetic field is needed to cause strain (deformation) in bulk members such as springs. For instance, a magnetic field of 400 kOe is needed to deform bulk members of Fe—Ni—Co—Ti alloys, and springs of Fe—Pd alloys are not deformed in a magnetic field of up to 20 kOe. Accordingly, actuators comprising magnetic shape memory alloy members giving large stroke and load in a relatively small magnetic field are desired.

OBJECT OF THE INVENTION

Accordingly, an object of the present invention is to provide a precisely controllable actuator generating large displacement and force with good response when a relatively small magnetic field is applied.

SUMMARY OF THE INVENTION

As a result of intense research in view of the above object, the inventors have found that because a stress generating when a magnetic field is applied to a magnetic shape memory alloy having a twin structure is proportional to the gradient of the magnetic field applied, and because this stress causes deformation due to the reorientation of martensitic unit cells, an actuator can be driven by deposing its magnetic shape memory alloy in a slanting magnetic field. The present invention has been completed based on this finding.

Thus, the actuator of the present invention comprises a magnetic, resilient, shape memory member formed by a substance having a twin structure, and a magnetic field generator, at least part of the magnetic, resilient, shape memory member being disposed in a slanting magnetic field generated from the magnetic field generator such that the twin structure is reoriented by the magnetic field, whereby the shape memory resilient member is driven.

The actuator is driven with the twin structure reoriented by a stress generating in the gradient of a magnetic field applied. The magnetic, resilient, shape memory member is located preferably at a position at which the magnetic field has the largest gradient. Because the stress applied to the magnetic, resilient, shape memory member is maximum at a position at which the magnetic field has the largest gradient, the reorientation of the twin structure of the magnetic, resilient, shape memory member can be induced even in a low magnetic field.

The magnetic, resilient, shape memory member of the actuator may be a coil spring or a plate spring. The magnetic field generated from the magnetic field generator is preferably 20 kOe or less, and the substance having a twin structure is preferably an Fe—Pd alloy from the aspect of workability. Accordingly, with the magnetic, resilient, shape memory member disposed in the gradient of the magnetic field, the coil spring or the plate spring can be displaced even in a low magnetic field of 20 kOe or less.

The actuator is driven preferably around the martensitic transformation-starting temperature Ms of the substance having a twin structure. With magnetic field generator disposed at both ends of the magnetic, resilient, shape memory member, the magnetic field can have a larger gradient.

BRIEF DESCRIPTION OF THE DRAWINGS

FIG. 10(a) is a schematic cross-sectional view showing a profile of the magnetic field gradient in the actuator A of the present invention; and FIG. 10(b) is a schematic cross-sectional view showing a profile of the magnetic field gradient in the actuator B of the present invention.

DETAILED DESCRIPTION OF THE PREFERRED EMBODIMENTS

The actuator of the present invention comprises a magnetic, resilient, shape memory member and a magnetic field generator, at least part of the magnetic, resilient, shape memory member being disposed in the gradient of a magnetic field generated from the magnetic field generator, whereby it is driven by a magnetic force given by the magnetic field generator.

Figure 1A:
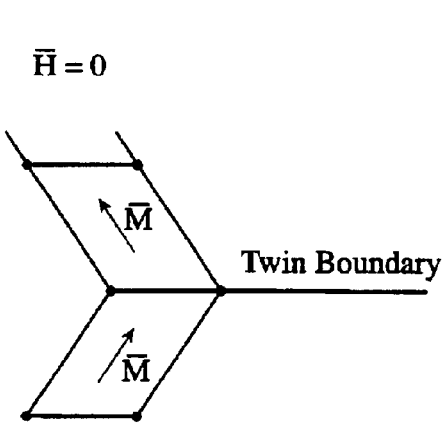
FIG. 1 is a schematic view showing the mechanism of a martensitic twin rearrangement by a magnetic field.
Figure 1B:
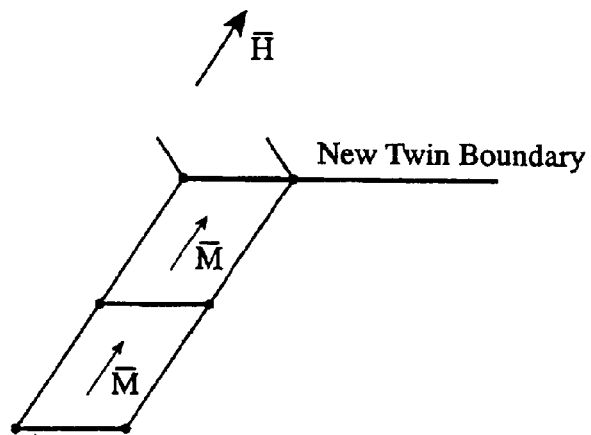

The magnetic, resilient, shape memory member changes its shape due to the reorientation of the twin structure in a region in which an external magnetic, field is applied. When a magnetic field is applied to the magnetic shape memory alloy subjected to transformation to a martensite phase, a martensitic twin (variant) boundary moves in the direction of an external magnetic field to cause the reorientation. As shown in FIG. 1(a), there are two transformation phases having different magnetization vectors in a state where there is no external magnetic field. As shown in FIG. 2(b), however, the external magnetic field rotates the twin structure, so that a transformation phase oriented in the direction of a magnetic field grows in place of another phase. Thus, twin boundaries move in the direction of a magnetic field, causing displacement in the magnetic shape memory alloy. Such displacement is also induced by temperatures and external stress.

Figure 2:
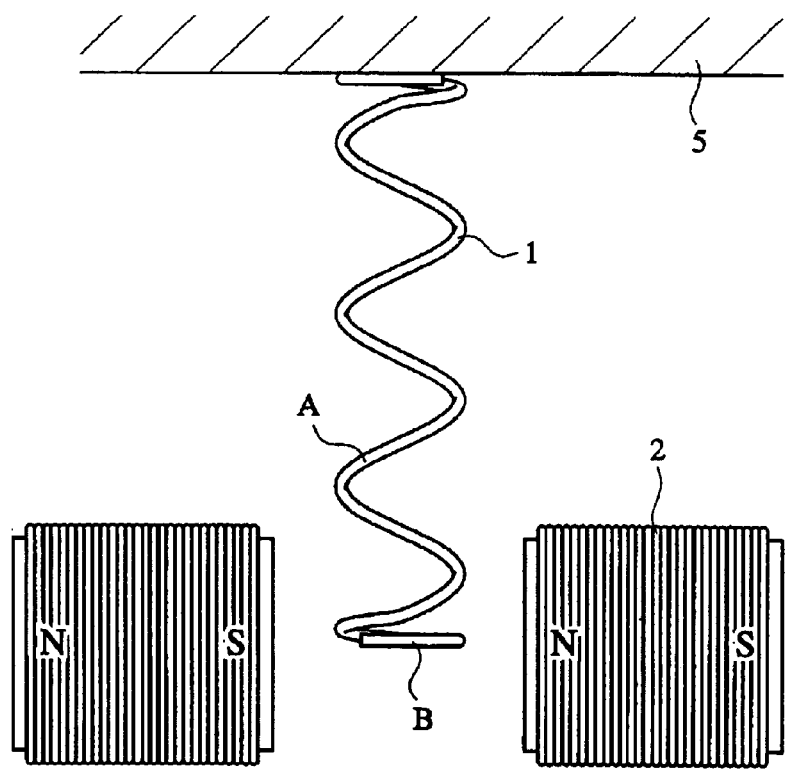
FIG. 2 is a view showing a coil-shaped magnetic, resilient, shape memory member, to which a magnetic field is applied.
Figure 3:
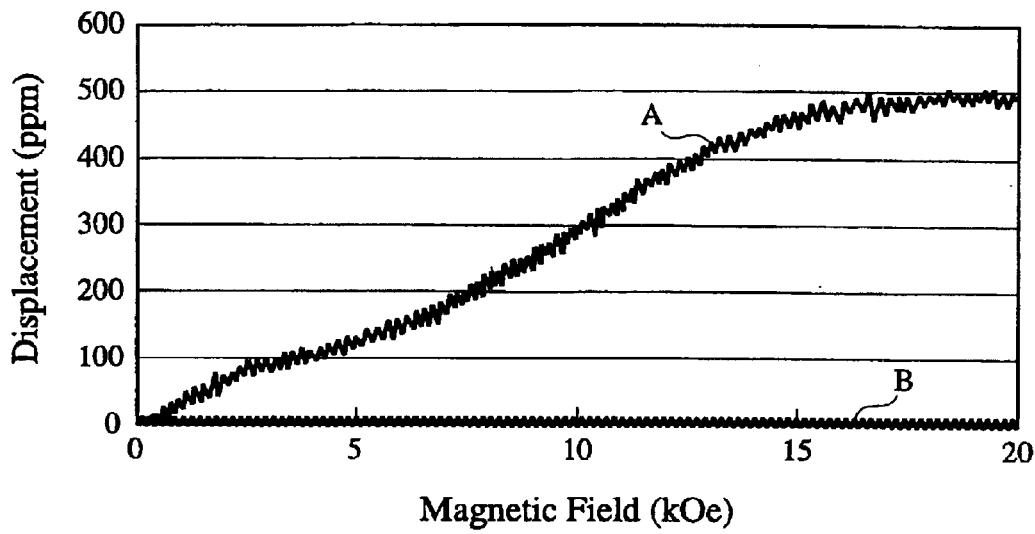
FIG. 3 is a graph showing the relation between strain (displacement) and the intensity H of a magnetic field when a magnetic field is applied to a magnetic, resilient, shape memory member.

The operation principle of the actuator of the present invention will be explained referring to FIGS. 2 to 4. FIG. 2 shows a coil-shaped magnetic, resilient, shape memory member 1 and magnetic field generators 2 for generating a magnetic field applied thereto. Each magnetic field generator 2 has a pair of opposing magnetic poles, and the magnetic, resilient, shape memory member 1 has a portion A located outside a region between the magnetic poles and a portion B located between the opposing magnetic poles. FIG. 3 shows the relation between the intensity H of the magnetic field and the displacement of the magnetic, resilient, shape memory member 1 in such an arrangement, when the magnetic field generators 2 are energized to generate a magnetic field at 20° C. The higher the intensity H of the magnetic field, the larger the displacement of the magnetic, resilient, shape memory member 1 in the portion A, as shown in FIG. 3. On the other hand, there is no displacement in the portion B of the magnetic, resilient, shape memory member 1 until the magnetic field reaches 20 kOe, as shown in FIG. 3.

This is because the portion A disposed in the slanting magnetic field is subjected to a stress expressed by the following formula by the magnetic field. On the other hand, because the portion B is disposed in a constant magnetic field having no gradient, no stress is generated, resulting in no displacement. Because the stress (F) is proportional to the gradient (dH/dx) of the magnetic field, a stress exerted by the magnetic field can be made maximum by locating the resilient shape memory member at a position at which the gradient of the magnetic field is maximum.

$$F = grad\ M \cdot H = \rho m(dH/dx),$$

wherein F represents an electromagnetic force, M represents a magnetic moment, H represents the intensity of the magnetic field, m represents a magnetization ratio, $\rho$ represents the density of a material, x represents a distance, and dH/dx represents the gradient of the magnetic field.

Figure 4:
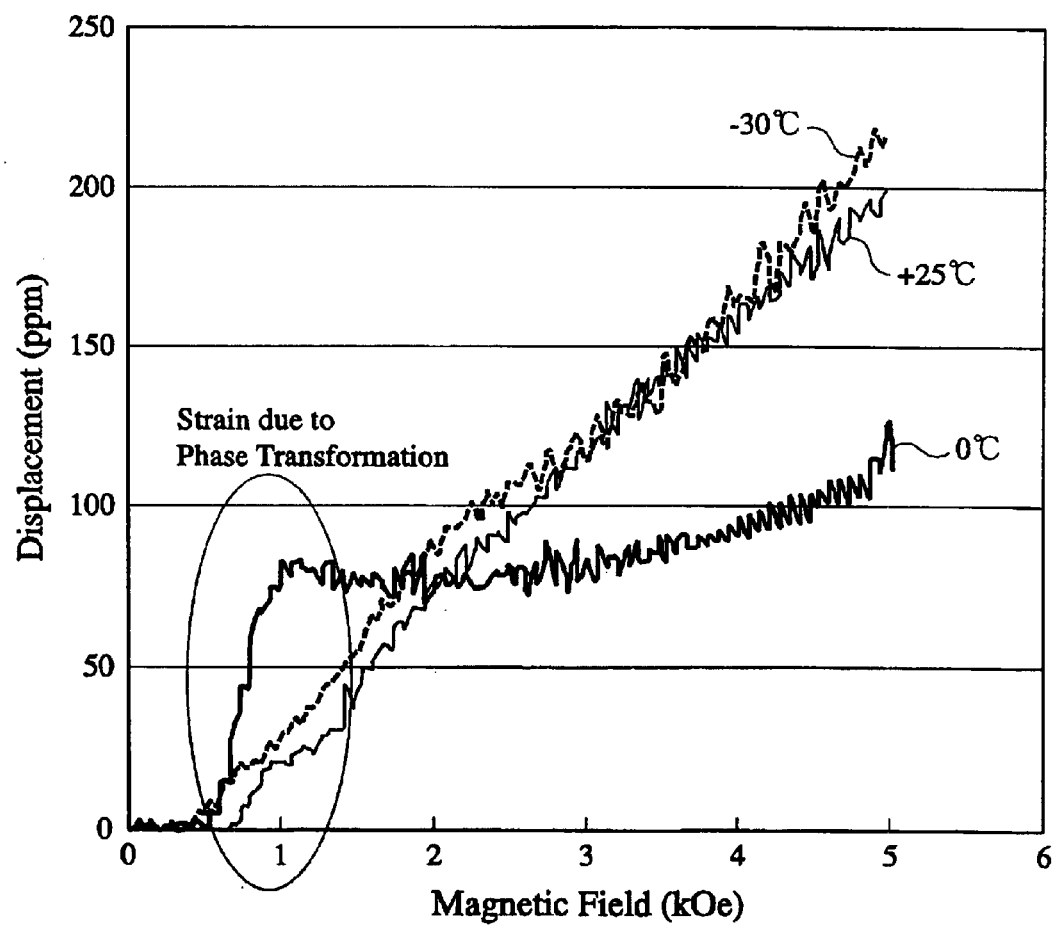
FIG. 4 is a graph showing the relation between strain (displacement) and the intensity H of a magnetic field when a magnetic field is applied to a magnetic, resilient, shape memory member set at each temperature of −30° C., 0° C. and +25° C.

FIG. 4 shows the change of strain (displacement) relative to the intensity H of a magnetic field, when a coil-shaped, magnetic, resilient, shape memory member 1 made of an Fe—Pd alloy is disposed in a slanting magnetic field generated from the magnetic field generator 2 to apply the magnetic field to the magnetic, resilient, shape memory member 1. As shown in FIG. 4, when the magnetic field is applied to the magnetic, resilient, shape memory member 1, whose temperature is set at −30° C. to +25° C., displacement is generated by stress as the magnetic field (H) increases in any case. However, though only 25 ppm or less of displacement takes place in as low a magnetic field as about 1 kOe at temperatures (−30° C., 25° C.) at which no transformation to a martensite phase occurs, about 80 ppm of displacement occurs in a magnetic field of nearly 1 kOe, when the Fe—Pd alloy is subjected to transformation to the martensite phase by cooling the Fe—Pd alloy to about 0° C. This is due to the fact that the twin structure of the magnetic, resilient, shape memory member subjected to martensitic transformation is reoriented. Accordingly, when the magnetic, resilient, shape memory member 1 having a martensite phase is disposed in a slanting magnetic field, stress exerted to the magnetic, resilient, shape memory member 1 induces the reorientation of the twin structure, resulting in the displacement. Because the stress necessary for the reorientation of the twin structure may be smaller than stress for causing displacement in the magnetic, resilient, shape memory member 1, it is possible to generate a relatively large displacement even in a low magnetic field of about 1 kOe.

Thus, by the reorientation of the twin structure of the magnetic, resilient, shape memory member, the actuator of the present invention can be driven even in such a low magnetic field whose attraction force can cause substantially no strain. Also, with the magnetic, resilient, shape memory member disposed in a slanting magnetic field, the reorientation of the twin structure is induced even in such a low magnetic field that would not induce the reorientation of the twin structure without gradient, whereby the actuator can be driven.

The magnetic, resilient, shape memory member of the actuator may be constituted by a plate, a round rod, a wire, a thin film, etc. The magnetic, resilient, shape memory member may be a coil or plate spring, which gives large stroke and load. For the purpose of the reduction of the actuator in its size and weight, the magnetic, resilient, shape memory member such as a coil or plate spring is driven preferably in as low a magnetic field as possible. In the actuator of the present invention, the magnetic field applied to the magnetic, resilient, shape memory member is preferably 20 kOe or less, more preferably 5 kOe or less, most preferably 1 to 2 kOe.

In the actuator of the present invention, the magnetic, resilient, shape memory member is disposed at a position at which the magnetic field has the largest gradient and in a direction in which the member is most deformed. With such arrangement, a stress field energy predominantly contributes the phase transformation, whereby the actuator can be driven in a lower magnetic field.

When the shape memory alloy is gradually cooled from an austenite phase while measuring by a differential thermal analyzer, a differential scanning calorimeter, etc., the martensitic transformation-starting temperature Ms and the martensitic transformation-terminating temperature Mf are recorded in this order. Oppositely, when the shape memory alloy is gradually heated from the martensitic transformation-starting temperature Ms, the austenitic transformation-starting temperature As and the austenitic transformation-terminating temperature are recorded in this order. Though the actuator is usually used at temperatures lower than the austenite transformation-starting temperature As, at which the temperature does not have large influence, it is preferably used around the martensitic transformation-starting temperature Ms, because the shape memory alloy has low initial permeability in a temperature region of a martensite phase.

The magnetic shape memory alloy may be an Fe—Pt alloy, an $Ni_2$—Mn—Ga alloy, etc. in addition to the above Fe—Pd alloy. Among them, the Fe—Pd alloy is preferable because of excellent workability.

As described above, the actuator of the present invention moves the shape memory resilient member by inducing the reorientation of the twin structure by a magnetic field. The actuator may have a structure that an auxiliary stress is applied to a driving means in addition to the stress by a magnetic field. Though not particularly restrictive, the method for applying an auxiliary stress may be, for instance, such a method that with a magnetic body mounted to the magnetic, resilient, shape memory member of the actuator, the load of the magnetic body is applied as stress.

Figure 5A:
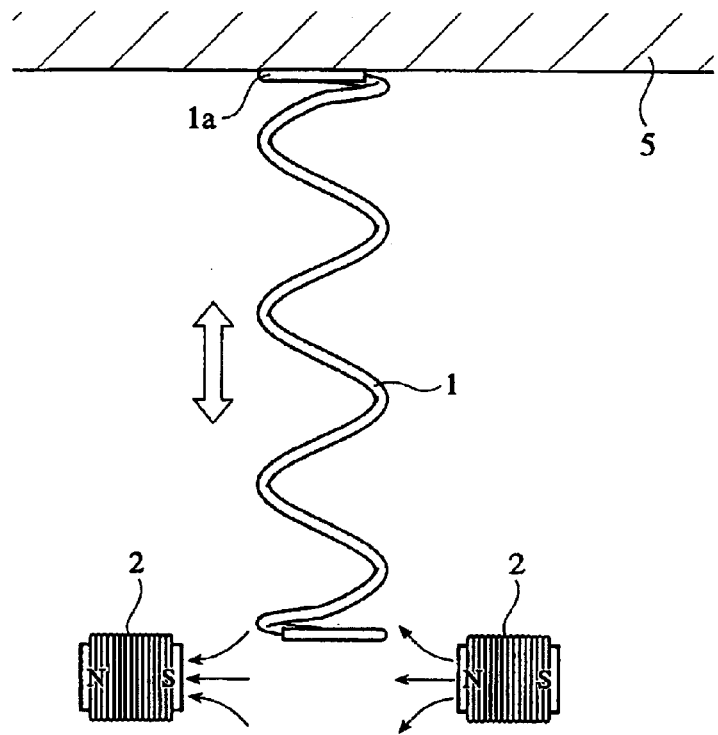
FIG. 5(a) is a schematic view showing an example of the actuator of the present invention, in which an upper end of the magnetic, resilient, shape memory member is supported by a base.

FIGS. 5(a) and (b) show examples of the actuator of the present invention. This coil actuator comprises a spring-shaped, magnetic, resilient, shape memory member 1 and a pair of magnetic field generators 2 arranged such that their opposite magnetic poles are facing to each other, an end 1a of the magnetic, resilient, shape memory member 1 being supported by a base 5. In the example shown in FIG. 5(a), the end 1a of the magnetic, resilient, shape memory member 1 is positioned on the upper side, and a pair of magnetic field generators 2 are arranged perpendicularly to the axis of the magnetic, resilient, shape memory member 1 on the lower side of the magnetic, resilient, shape memory member 1. In the example shown in FIG. 5(b), an end of 1a of the magnetic, resilient, shape memory member 1 is positioned on the lower side, and a pair of magnetic field generators 2 are arranged perpendicularly to the axis of the magnetic, resilient, shape memory member 1 on the lower side of the magnetic, resilient, shape memory member 1.

Figure 5B:
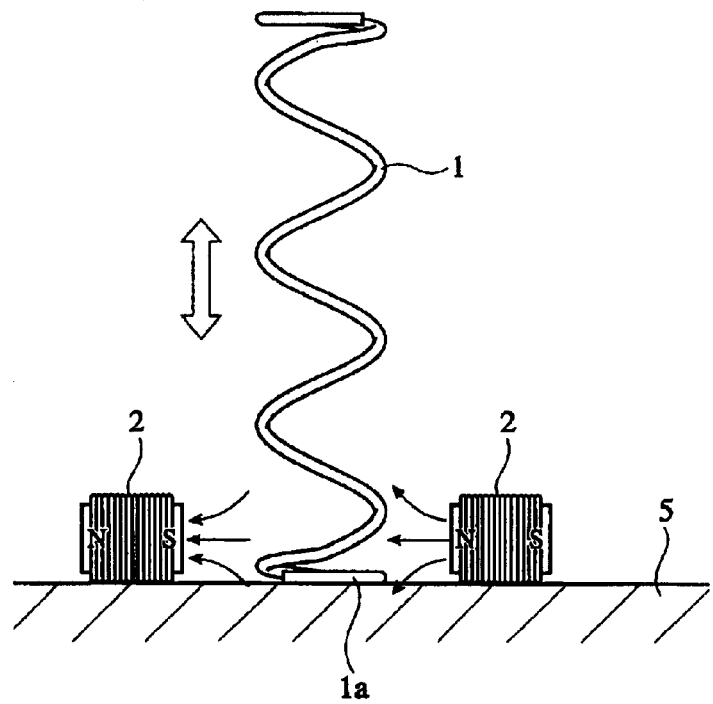
FIG. 5(b) is a schematic view showing another example of the actuator of the present invention, in which a lower end of the magnetic, resilient, shape memory member is supported by a base.

In the case of FIG. 5(a), the magnetic, resilient, shape memory member 1 is an extension coil spring, and a magnetic field generated by energizing the magnetic field generators 2 induces a phase transformation (reorientation of the twin structure), so that the magnetic, resilient, shape memory member 1 moves downward. In the case of FIG. 5(b), the magnetic, resilient, shape memory member 1 is a compression coil spring, and a magnetic field generated by energizing the magnetic field generators 2 induces a phase transformation, so that the magnetic, resilient, shape memory member 1 moves downward. In both cases, when the magnetic field generators 2 are inactivated, the magnetic field disappears, so that the coil spring returns to the original position. Thus, the magnetic, resilient, shape memory member 1 can be driven in the direction shown by the arrow by turning on and off the magnetic field generators 2.

In the above Examples, the magnetic, resilient, shape memory member 1 constituting the actuator is subjected to plastic deformation in advance in the state of a martensite phase, depending on the driving direction by the phase transformation. For instance, when the magnetic, resilient, shape memory member 1 is an extension coil spring, in which stress is generated in an extension direction, the coil spring is compressed in advance. On the other hand, when the magnetic, resilient, shape memory member 1 is a compression coil spring, in which stress is generated in a compression direction, the coil spring is extended in advance in the state of a martensite phase. The magnetic field generators 2 may be usual electromagnetic coils. The magnetic field generators 2 need not be arranged such that opposite magnetic poles face each other as shown in FIG. 5, but may be arranged such that the same magnetic poles face each other.

Figure 6:
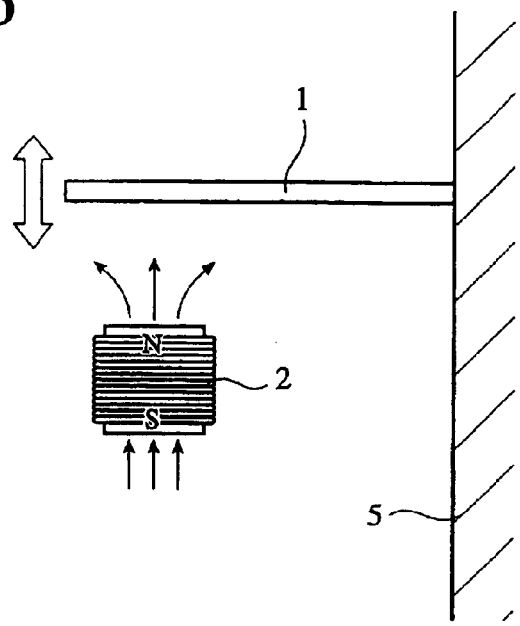
FIG. 6 is a schematic view showing a further example of the actuator of the present invention, in which the magnetic, resilient, shape memory member is supported in a cantilever manner.

The magnetic, resilient, shape memory member 1 need not be a coil spring but may be, for instance, a plate spring as shown in FIG. 6. In the example of FIG. 6, the plate spring-shaped, magnetic, resilient, shape memory member 1 is attached to a base 5 in a cantilever manner, and a magnetic field generator 2 is disposed on either side of displacement directions near the magnetic, resilient, shape memory member 1. A magnetic field generated by energizing the magnetic field generator 2 induces a phase transformation in the magnetic, resilient, shape memory member 1, resulting in displacement.

Figure 7:
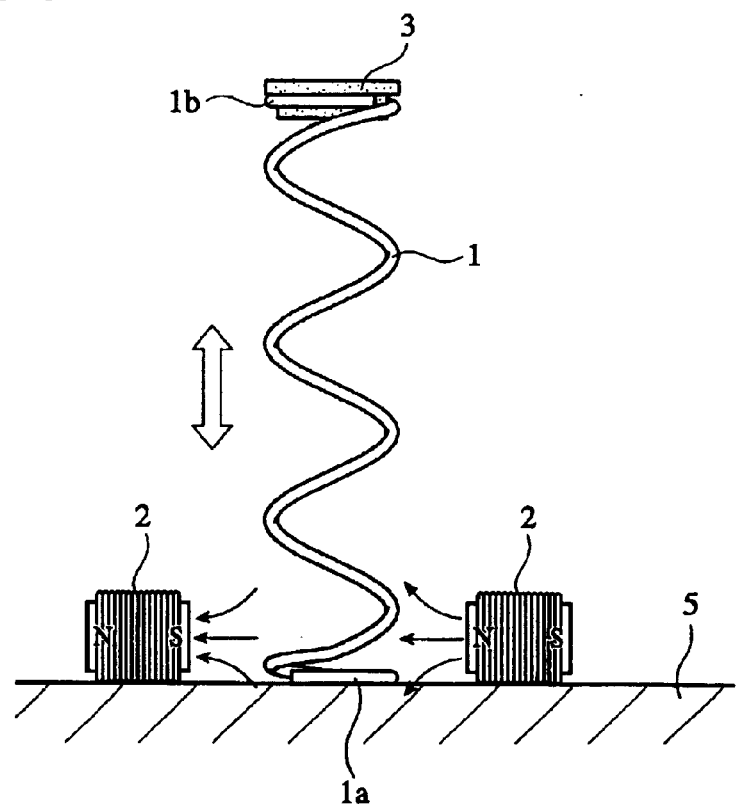
FIG. 7 is a schematic view showing a still further example of the actuator of the present invention, in which an auxiliary stress is applied to the magnetic, resilient, shape memory member.

FIG. 7 shows the same example as in FIG. 5(b) except that a soft magnetic body 3 is mounted to an end of 1b of the magnetic, resilient, shape memory member 1. The soft magnetic material 3 is attracted to or repelled from the magnetic field generator 2, and the load of the soft magnetic material 3 functions as an auxiliary stress to the magnetic, resilient, shape memory member 1. The use of the auxiliary stress makes it possible to drive the actuator by a lower magnetic field.

Figure 8:
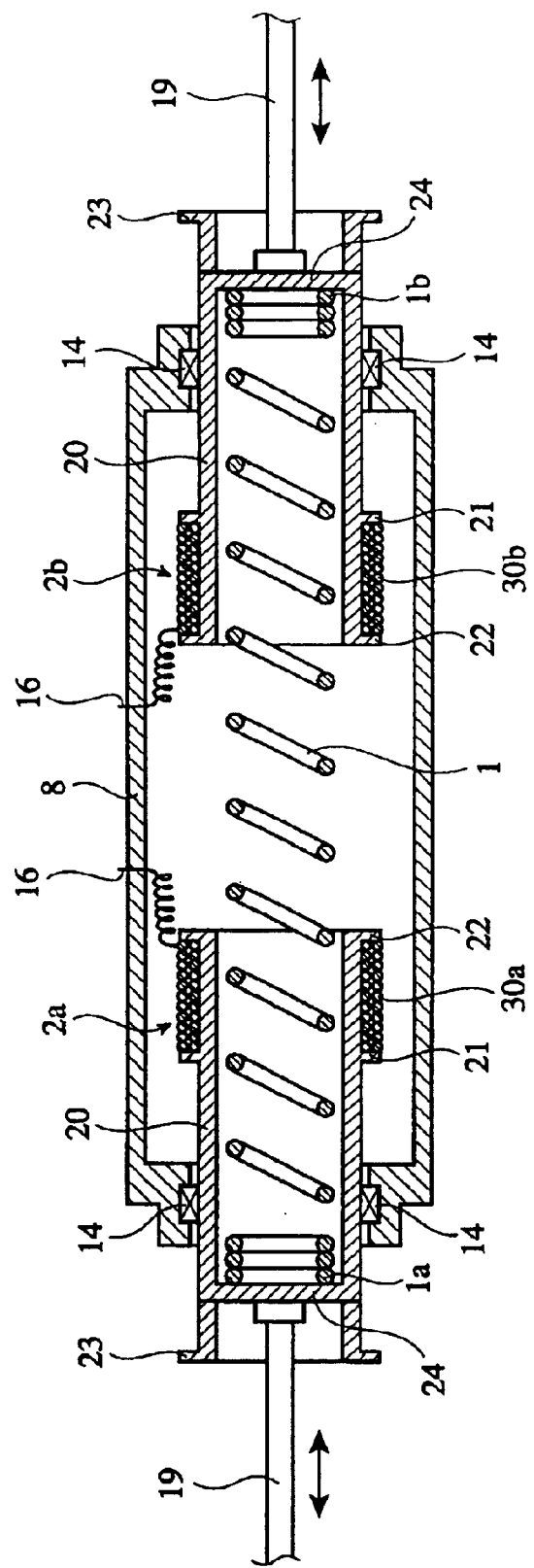
FIG. 8 is a schematic, cross-sectional view showing a still further example of the actuator of the present invention comprising a coil spring-shaped, magnetic, resilient, shape memory member surrounded by a pair of electromagnetic coils.
Figure 9:
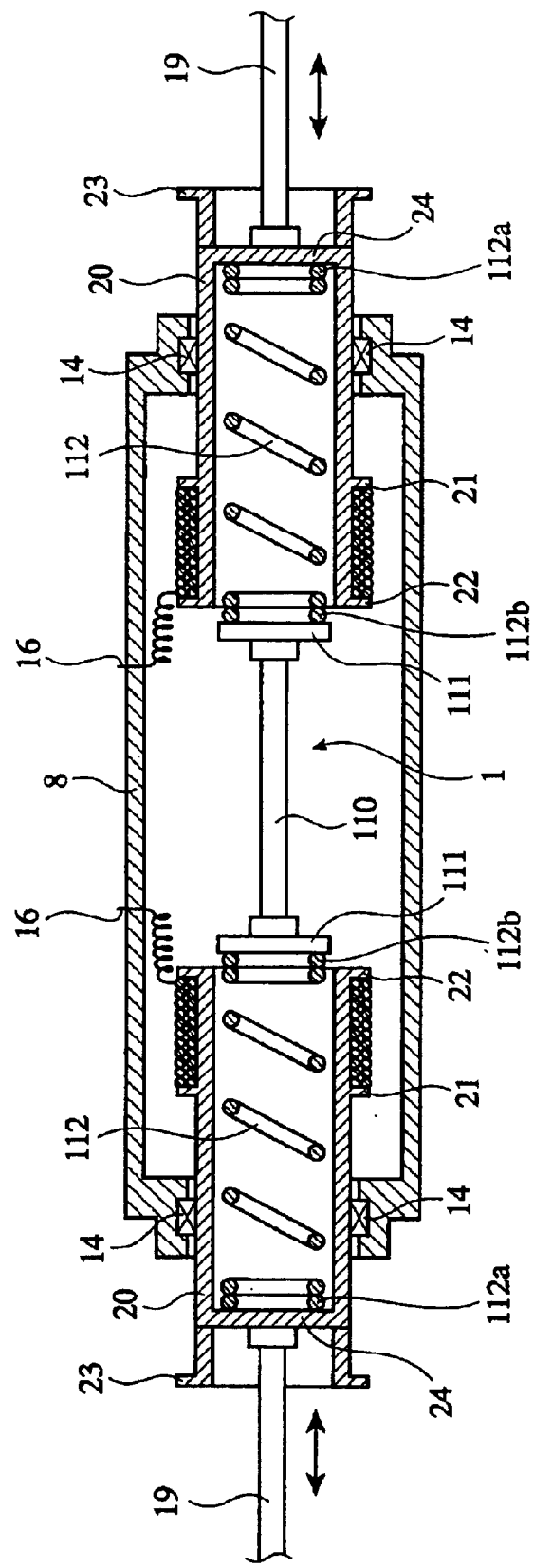
FIG. 9 is a schematic view showing a still further example of the actuator of the present invention comprising coil spring-shaped, magnetic, resilient, shape memory members mounted to both ends of a shaft, which are surrounded by electromagnetic coils.

FIGS. 8 and 9 are cross-sectional views showing further examples of the actuators of the present invention. The actuator of FIG. 8 comprising a coil spring-shaped, magnetic, resilient, shape memory member 1, a pair of magnetic field generators 2a, 2b such as electromagnetic coils fixed to both ends of 1a, 1b of the magnetic, resilient, shape memory member 1, rods 19, 19 fixed to the outer sides of the magnetic field generators for getting the output of the actuator, and a hollow cylindrical body 8 covering these parts.

Each magnetic field generator 2a, 2b comprises an electromagnetic coil 30a, 30b, and a bobbin 20 for supporting the electromagnetic coil 30a, 30b. The bobbin 20 is made of a non-magnetic material such as plastics, etc., and the bobbin 20 has a stopper 23 at one end. The electromagnetic coil 30a, 30b is wound around the bobbin 20 between two flanges 21 and 22. The bobbin 20 is provided with a support member 24 on the side of the stopper 23. Ends 1a, 1b of the magnetic, resilient, shape memory member 1 are fixed to an inner surface of the support member 24, and the output-getting rod 19, 19 is fixed to an outer surface of the support member 24. Each magnetic field generator 2a, 2b is movably supported by each annular projection of the hollow cylindrical cover 8 via a bearing 14, 14.

The magnetic, resilient, shape memory member 1 of the actuator shown in FIG. 9 comprises an iron shaft 110, and coil springs 112 made of a magnetic shape memory alloy at both ends of the iron shaft 110. Both ends of the shaft 110 are fixed to inner surfaces of support members 111, and one end 112b of the coil spring 112 is fixed to an outer surface of the support member 111. The other end 112a of the coil spring 112 is fixed to a support member 24. Because other parts in the actuator of FIG. 9 than the magnetic, resilient, shape memory member 1 are the same as those in the actuator of FIG. 8, their explanations are omitted.

In the case of FIG. 8, the magnetic, resilient, shape memory member 1 may be either an extension coil spring or a compression coil spring. For instance, when an extension coil spring is used as the magnetic, resilient, shape memory member 1, the magnetic, resilient, shape memory member 1 is driven in an extension direction as a whole by a magnetic field generated. On the other hand, when a compression coil spring is used as the magnetic, resilient, shape memory member 1, the magnetic, resilient, shape memory member 1 is driven in a compression direction as a whole by a magnetic field generated.

In the case of FIG. 9, the spring used as the magnetic, resilient, shape memory member 1 may be either an extension coil spring or a compression coil spring, and different coil springs may be combined. With different types of the coil springs attached, the driving directions of the actuator can be set arbitrarily. For instance, when extension coil springs are used on both sides, the magnetic, resilient, shape memory member 1 is driven in an extension direction as a whole by a magnetic field generated. On the other hand, when compression coil springs are used on both sides, the magnetic, resilient, shape memory member 1 is driven in a compression direction as a whole by a magnetic field generated. Further, when different springs of an extension coil spring and a compression coil spring are used on both sides, the magnetic, resilient, shape memory member 1 can be driven in either one direction as a whole.

Because the reorientation of the twin structure of the actuator takes place three-dimensionally, the actuator can provide complicated motions such as extension, bending, twisting, etc., in addition to the above motions. Also, with a magnetic field having a periodically changing intensity, shape changes with predetermined ratios can be caused in the magnetic, resilient, shape memory member, and the movement course of the actuator can be controlled by changing the direction of a magnetic field. Because the actuator of the present invention can move a spring, etc. providing large stroke and load in a low magnetic field, it contributes to the reduction in size and weight of robots, a precision tools, etc.

The present invention will be explained in more detail referring to Examples below without intention of restricting the present invention thereto.

EXAMPLE 1

A wire of 1.17 mm in diameter was produced from an Fe—Pd alloy (30 atomic % Pd), and wound around a jig to form a magnetic shape memory coil spring. This magnetic shape memory coil spring was sealed in a quartz pipe in vacuum ($10^{-5}$ Torr), heated at 1200° C. for 24 hours in an electric furnace, and then cooled to 0° C. in an oil to cause transformation to a martensite phase, in which the magnetic shape memory coil spring was subjected to compression deformation. The specifications of the resultant spring are as follows:

| | |
|---|---|
| Wire diameter of coil spring: | 1.17 mm, |
| Outer diameter of spring: | 6.83 mm, |
| Free length: | 20 mm, and |
| Pitch: | 5.05 mm. |

The above magnetic shape memory coil spring 1 was placed in a slanting magnetic field generated from electromagnetic coils 2 as magnetic field generators, as shown in FIG. 5(a). When 1 kOe of a static magnetic field generated from the electromagnetic coils 2 was applied to the magnetic shape memory coil spring 1 cooled to 0° C., the magnetic shape memory coil spring 1 was displaced downward. At this time, the gradient of a magnetic field in a driven portion of the magnetic shape memory coil spring 1 was $1.4 \times 10^6$ Oe/m. FIG. 4 shows the displacement of the magnetic shape memory coil spring 1 when the static magnetic field was changed from 1 kOe to 5 kOe at each temperature of −30° C., 0° C. and +25° C.

As shown in FIG. 4, when the temperature of the magnetic shape memory coil spring 1 was set at 0° C., the displacement due to the phase transformation was about 80 ppm in a magnetic field of about 1 kOe. On the other hand, when the temperature of the magnetic, resilient, shape memory member 1 was set at −30° C. and +25° C., the displacement was 25 ppm or less in a magnetic field of about 1 kOe.

EXAMPLE 2

Two magnetic shape memory coil springs were produced in the same manner as in Example 1. Also, a cylindrical electromagnetic coil 2 of 13 mm in outer diameter, 5 mm in length and 2 nm in thickness was produced by winding a wire having a diameter of 0.5 mm around a bobbin. A first magnetic shape memory coil spring 1 was penetrated into one electromagnetic coil 2, which was positioned at a center of the magnetic shape memory coil spring 1, to provide an actuator A. A second magnetic shape memory coil spring 1 was penetrated into two electromagnetic coils 2, which were positioned at both ends of the magnetic shape memory coil spring 1, to provide an actuator B. In both cases, a gap between the electromagnetic coil 2 and the magnetic shape memory coil spring 1 was 1 mm.

Measurement was conducted on the gradient of a magnetic field generated when the electromagnetic coils 2 of the actuators A and B were energized. FIG. 10(a) shows a profile of the magnetic field gradient in the actuator A, and FIG. 10(b) shows a profile of the magnetic field gradient in the actuator B. While the gradient of the magnetic field at the electromagnetic coils 2 in the actuator A was $3.2 \times 10^6$ Oe/m, the gradient of the magnetic field at the electromagnetic coils 2 at each end of the actuator B was $6.4 \times 10^6$ Oe/m, which was twice that in the actuator A. It has thus been verified that when the electromagnetic coils are disposed at both ends of the magnetic shape memory coil spring 1, a large gradient is obtained in the resultant magnetic field, making it possible to drive the actuator with a lower magnetic field.

As described above, because the magnetic, resilient, shape memory member made of a substance having a twin structure is disposed in a slanting magnetic field in the actuator of the present invention, it can be driven due to the reorientation of the twin structure even in a low magnetic field. Accordingly, the actuator of the present invention has good response with large displacement and output force, thus enabling precise control.

What is claimed is:

1. An actuator comprising a magnetic, resilient, shape memory member formed by a substance having a twin structure, and a magnetic field generator, at least part of said magnetic, resilient, shape memory member being disposed in a gradient magnetic field generated from said magnetic field generator such that said twin structure is reoriented by said magnetic field, whereby said shape memory resilient member is driven.

2. The actuator according to claim 1, wherein said twin structure is reoriented by stress generated in said gradient magnetic field.

3. The actuator according to claim 1, wherein said magnetic, resilient, shape memory member is located at a position at which there is the largest gradient magnetic field.

4. The actuator according to claim 1, wherein said resilient shape memory member is a coil spring or a plate spring.

5. The actuator according to claim 1, wherein said magnetic field is 20 kOe or less.

6. The actuator according to claim 1, wherein said substance having a twin structure is an Fe—Pd alloy.

7. The actuator according to claim 1, wherein said actuator is driven around the martensitic transformation-starting temperature Ms of said substance having a twin structure.

8. The actuator according to claim 1, wherein said magnetic field generator is disposed at both ends of said magnetic, resilient, shape memory member.

* * * * *